United States Patent
Park

(10) Patent No.: US 7,432,155 B2
(45) Date of Patent: Oct. 7, 2008

(54) METHODS OF FORMING A RECESSED GATE

(75) Inventor: Jin-Jun Park, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 40 days.

(21) Appl. No.: 11/522,327

(22) Filed: Sep. 18, 2006

(65) Prior Publication Data

US 2007/0072365 A1   Mar. 29, 2007

(30) Foreign Application Priority Data

Sep. 26, 2005   (KR) .................. 10-2005-0089074

(51) Int. Cl.
*H01L 21/336* (2006.01)

(52) U.S. Cl. .............. 438/259; 438/589; 438/592

(58) Field of Classification Search ........... 438/259, 438/270, 589, 592
See application file for complete search history.

(56) References Cited

U.S. PATENT DOCUMENTS 6,939,765 B2   9/2005   Kim et al.
2003/0102500 A1   6/2003   Cross
2006/0289931 A1*   12/2006   Kim et al. ................ 257/330
2007/0059889 A1*   3/2007   Yoo et al. ................ 438/282
2007/0077713 A1*   4/2007   Ha et al. ................. 438/270

FOREIGN PATENT DOCUMENTS

| JP | 2003-023104 | 1/2003 |
| KR | 10-2004-0079518 | 9/2004 |
| KR | 10-2005-0007637 | 1/2005 |

\* cited by examiner

*Primary Examiner*—M. Wilczewski
*Assistant Examiner*—Toniae M. Thomas
(74) *Attorney, Agent, or Firm*—Lee & Morse, P.C.

(57) ABSTRACT

A method of forming a recessed gate may include forming a gate recess including an upper recess and a lower recess at an upper portion of a semiconductor substrate, the lower recess may have a width substantially wider than that of the upper recess, forming a gate insulation layer on an inner surface of the gate recess, forming a first silicon layer on the semiconductor substrate including the gate insulation layer to form an open void within the gate recess, forming a stop layer having a high thermal resistance on the first silicon layer to prevent a void from moving around within the gate recess, forming a second silicon layer on the first silicon layer, and patterning the second and the first silicon layers to form a gate electrode.

20 Claims, 8 Drawing Sheets

METHODS OF FORMING A RECESSED GATE

BACKGROUND OF THE INVENTION

1. Field of the Invention

The invention relates to a method of forming a gate. More particularly, the invention relates to a method of forming a gate in a recess that includes a lower portion that is substantially wider than an upper portion.

2. Description of the Related Art

As semiconductor devices become highly integrated, active regions of semiconductor devices and various conductive structures formed on the active region(s) are decreasing in size. Accordingly, channel lengths of metal-oxide semiconductor (MOS) transistors may be less than several micrometers.

As a channel length of a MOS transistor becomes shorter, voltages applied to source, drain and/or channel regions of the MOS transistor, have a larger influence on an electric field. This phenomenon is often called "a short channel effect." As a result of the short channel effect, e.g., a threshold voltage may drop because the channel region may be affected not only by a gate voltage but also by electrons in a depletion region, an electric field and a voltage distribution of the source/drain regions.

Generally, a dynamic random-access memory (DRAM) device may require a high operating speed and a large data storage capacitance. Generally, as many unit cells as possible may be formed on a semiconductor substrate. Thus, a gate size of the DRAM device may have to be reduced in order to form a semiconductor device having a high degree of integration. The reduction of the gate size may result in a decrease of a channel length. A reduction of the channel length may cause, via the short channel effect, an operational defect, e.g., a dynamic refresh defect or a static refresh defect.

Transistors having a recessed channel region have been developed as a result of efforts for reducing and/or suppressing the short channel effect. In such transistors, a gate electrode of the transistor may be formed to fill up a gate recess formed at an upper portion of a semiconductor substrate so that a channel length sufficiently long for the operation of the transistor may be ensured in spite of the reduction of the gate size.

Such a recessed gate may be formed by a technique that includes sufficiently filling the gate recess with a conductive material. However, filling up the gate recess without a void is generally difficult because of a small width of the gate recess. Transistors having a gate recess with a lower portion substantially wider than an upper portion, have also been developed. However, in such transistors with a gate recess having a relatively wider lower portion, an opening of the gate recess may be closed before the wider lower portion of the gate recess is sufficiently filled with a conductive material, and a void may be formed in the gate recess.

When a void formed at a central portion of the gate recess does not directly make contact with a gate insulation layer formed on an inner sidewall of the gate recess, the void may not cause an operational defect of the transistor. However, the void may move in the gate recess and may make contact with the gate insulation layer during subsequent processing, and electrical characteristics of the transistor may be deteriorated.

FIG. 1 illustrates a cross-sectional view of a recessed gate having a void.

Referring to FIG. 1, a void 14 may be formed in a recessed gate 16, which may be formed on a substrate 10 to fill up a recess having a lower portion substantially wider than an upper portion. When the recessed gate 16 is formed using polysilicon, silicon atoms included in the recessed gate 16 may freely move in the recessed gate 16, so that the void(s) 14 may move in the recessed gate 16, and may make contact with a gate oxide layer 12 formed between the recessed gate 16 and the substrate 10. When the void 14 makes contact with the gate oxide layer 12, a leakage current may be generated, and a threshold voltage distribution of the MOS transistor may increase. Thus, electrical characteristics of the MOS transistor may be deteriorated, and a production yield of a semiconductor device may be reduced.

SUMMARY OF THE INVENTION

The invention is therefore directed to methods of forming a recessed gate, which substantially overcome one or more of the problems due to the limitations and disadvantages of the related art.

It is therefore a feature of embodiments of the invention to provide a method of forming a recessed gate wherein an operational defect due to a void within a gate electrode may be reduced and/or prevented.

It is therefore a separate feature of embodiments of the invention to provide a method for preventing a void from being generated during formation of a gate electrode filled into a gate recess having a lower portion wider than the upper portion.

It is therefore a separate feature of embodiments of the invention to provide a method for forming a recessed gate, wherein movement of the void may be prevented even though the void may be generated during formation of the gate electrode.

It is therefore a separate feature of embodiments of the invention to provide a method for forming a recessed gate that enables the gate electrode to maintain contact with a gate insulation layer, irrespective of whether a void is formed during formation of the gate electrode, so that a leakage current may not be generated and that a threshold voltage distribution may not be deteriorated.

At least one of the above and other features and advantages of the present invention may be realized by providing a method of forming a recessed gate, including forming a gate recess including an upper recess and a lower recess at an upper portion of a semiconductor substrate, the lower recess having a width substantially wider than that of the upper recess, forming a gate insulation layer on an inner surface of the gate recess, forming a first silicon layer on the semiconductor substrate including the gate insulation layer, forming a silicon oxide layer on the first silicon layer, performing heat treatment on the semiconductor substrate under a reducing atmosphere to selectively remove an oxygen component from the silicon oxide layer and to form a recess-filling layer of silicon on the semiconductor substrate, forming a second silicon layer on the recess-filling layer, and forming a gate electrode by patterning the second silicon layer and the recess-filling layer.

An upper portion of the semiconductor substrate may be anisotropically etched to form the upper recess, and a portion of the semiconductor substrate exposed by a bottom surface of the upper recess may be isotropically etched to form the lower recess. Forming the silicon oxide layer may be performed by supplying oxygen gas or water vapor onto the first silicon layer. The reducing atmosphere may include hydrogen gas. The heat treatment may be performed to remove substantially all the oxygen components from the silicon oxide layer. The first silicon layer may be formed using amorphous silicon doped with impurities having a first concentration, and the second silicon layer may be formed using polysilicon doped with impurities having a second concentration substantially lower than the first concentration.

The first concentration may be about $2.0 \times 10^{20}$ atoms/cm$^3$ to about $5.0 \times 10^{20}$ atoms/cm$^3$, and the second concentration may be about $1.0 \times 10^{20}$ atoms/cm$^3$ to about $2.0 \times 10^{20}$ atoms/cm$^3$. Forming the first silicon layer may include continuously forming the first silicon layer on the semiconductor substrate including the gate insulation layer. A ratio between the width of the upper recess and a thickness of the first silicon layer may be about 1:0.3 to about 1:0.4. The heat treatment may be performed at a temperature of about 850° C. to about 1,000° C. The silicon atoms included in at least one of the first silicon layer and the silicon oxide layer may move toward the gate recess to form the recess-filling layer that fills up the gate recess.

It is therefore a separate feature of embodiments of the invention to provide a method of forming a recessed gate including forming a gate recess including an upper recess and a lower recess at an upper portion of a semiconductor substrate, the lower recess having a width substantially wider than that of the upper recess, forming a gate insulation layer on an inner surface of the gate recess, forming a first silicon layer on the semiconductor substrate including the gate insulation layer to form an open void within the gate recess, forming a stop layer having a high thermal resistance on the first silicon layer to prevent a void from moving around within the gate recess, forming a second silicon layer on the first silicon layer, and patterning the second and the first silicon layers to form a gate electrode. The stop layer may be formed using silicon oxide. The stop layer may be formed by a thermal oxidation process. Removing the portion of the stop layer may include removing the portion of the stop layer by at least one of a chemical mechanical polishing process and an etch-back process. Forming the stop layer may include forming the stop layer to have a thickness larger than a thickness of the first silicon layer.

Prior to forming the second silicon layer, the method may include removing a portion of the stop layer that remains outside of the gate recess. Forming the first silicon layer may include continuously forming the first silicon layer on the semiconductor substrate including the gate insulation layer. A ratio between the width of the upper recess and a thickness of the first silicon layer is about 1:0.3 to about 1:0.4. Forming the stop layer may include filling the open void within the gate recess with the stop layer.

BRIEF DESCRIPTION OF THE DRAWINGS

The above and other features and advantages of the invention will become more apparent to those of ordinary skill in the art by describing in detail example embodiments thereof with reference to the attached drawings in which.

DESCRIPTION OF THE EMBODIMENTS

Figure 1:
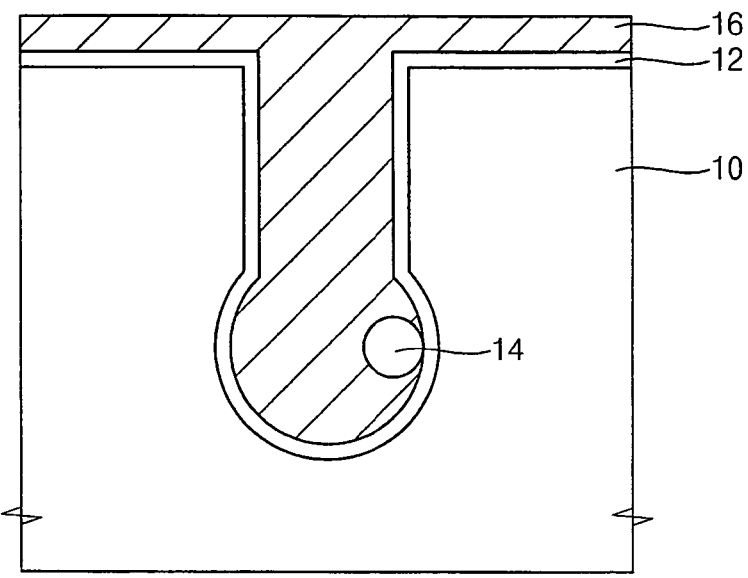
FIG. 1 illustrates a cross-sectional view of a recessed gate having a void formed using a conventional method.

Korean Patent Application No. 2005-89074 filed on Sep. 26, 2005, in the Korean Intellectual Property Office, and entitled: "Method of Forming a Recessed Gate," is incorporated by reference herein in its entirety.

The invention will now be described more fully hereinafter with reference to the accompanying drawings, in which example embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the invention are described herein with reference to schematic illustrations of cross-sectional illustration views of idealized resulting and/or intermediate structures of example embodiments of the invention. As such, variations from the shapes of the illustrations as a result, for example, of manufacturing techniques and/or tolerances, are to be expected. Thus, example embodiments of the invention should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are may not illustrate the actual shape of a respective region of a device, and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
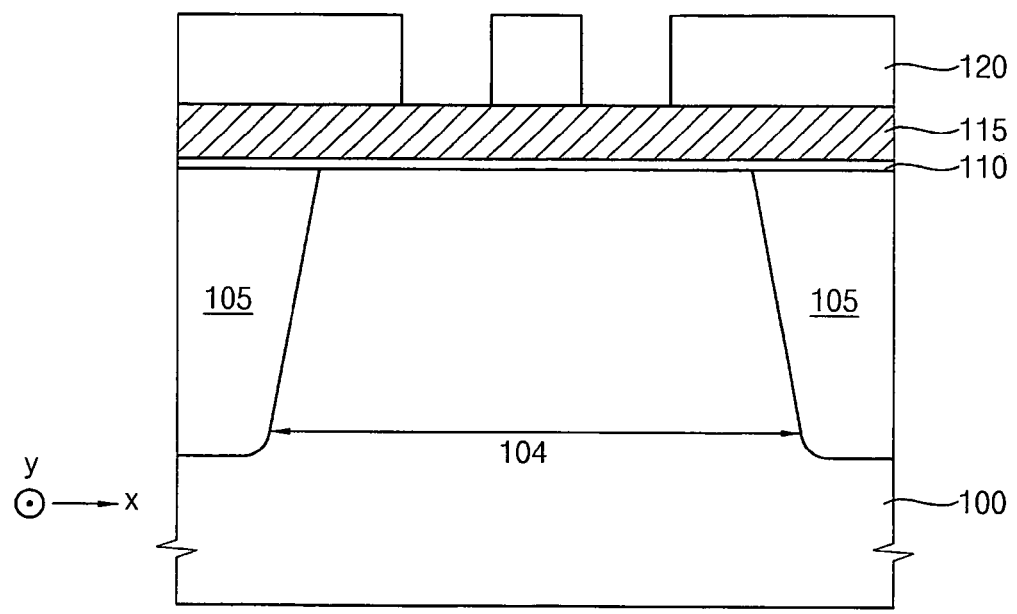
FIGS. 2 to 7 illustrate cross-sectional views of resulting structures of stages of a first example embodiment of a method of forming a recessed gate in accordance with one or more aspects of the invention.

FIGS. 2 to 7 illustrate cross-sectional views of resulting structures of stages of a first example embodiment of a method of forming a recessed gate in accordance with one or more aspects of the invention. More particularly, FIG. 2 illustrates a cross-sectional view of a pad oxide layer 110, a first mask layer 115 and a first photoresist pattern 120, which may be formed on a semiconductor substrate 100.

Referring to FIG. 2, an isolation layer 105 may be formed at an upper portion of the semiconductor substrate 100. The isolation layer 105 may define an active region 104 of the semiconductor substrate 100. The semiconductor substrate 100 may include a silicon wafer. The active region 104 may extend along a first direction, e.g., x-direction, of the semiconductor substrate 100.

In embodiments of the invention, the isolation layer 105 may be formed by a shallow trench isolation (STI) process. In embodiments of the invention, the isolation layer 105 may have a sidewall inclined at an angle of about 80° to about 90° relative to the semiconductor substrate 100 to reduce and/or prevent formation of a silicon fence during, e.g., subsequent formation of a gate recess 130 (see FIG. 4).

The silicon fence may correspond to the silicon wafer disposed between the isolation layer 105 and the gate recess 130, may have a fence-like shape that is disposed lengthwise along a second direction, e.g., y-direction, substantially perpendicular to the first direction of the semiconductor substrate 100. When the sidewall angle of the isolation layer 105 is substantially smaller than, e.g., about 80° relative to the semiconductor substrate 100, the silicon fence may be formed between the isolation layer 105 and the gate recess 130. When the silicon fence is formed between the isolation layer 105 and the gate recess 130, electrons in a channel region may move through the silicon fence, so that a threshold voltage may drop. Thus, electrical characteristics of a semiconductor device including the gate recess may be deteriorated.

The pad oxide layer 110 and the first mask layer 115 may be sequentially formed on the semiconductor substrate 100 including the isolation layer 105. In embodiments of the invention, the first mask layer 115 may be formed using, e.g., a nitride such as silicon nitride. A first photoresist film may be formed on the first mask layer 115, and the first photoresist film may be partially removed from the semiconductor substrate 100 to form the first photoresist pattern 120 on the first mask layer 115. The first photoresist pattern 120 may be used for forming the gate recess 130.

Figure 3:
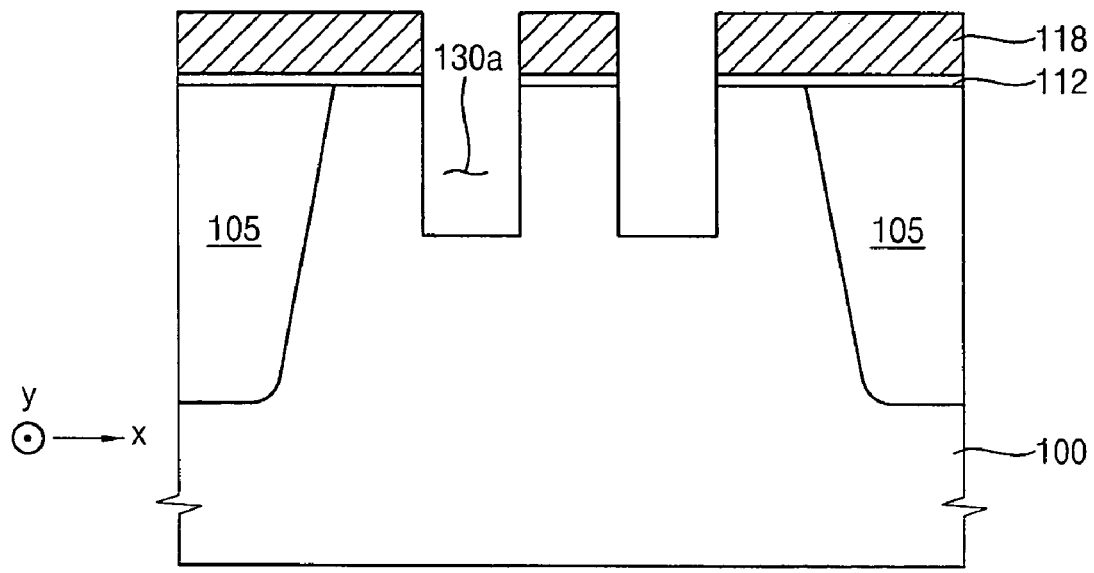
Figure 4:
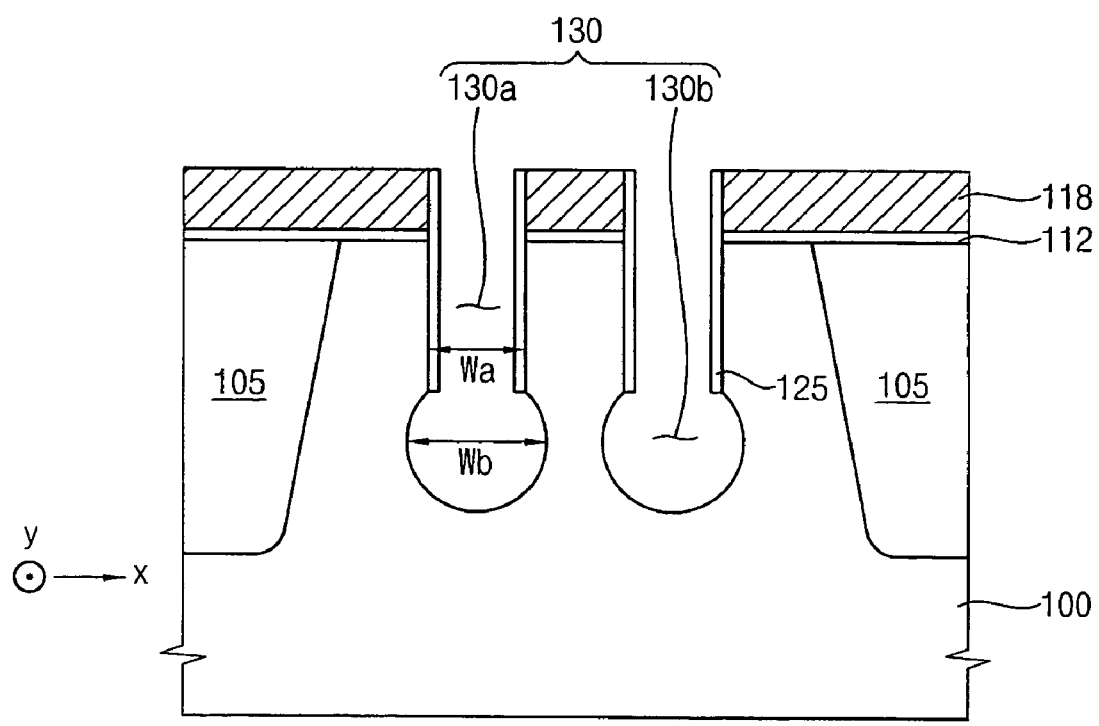

FIG. 3 illustrates a cross-sectional view of an upper recess 130a formed at an upper portion of the semiconductor substrate 100, and FIG. 4 illustrates a cross-sectional view of a lower recess 120b formed beneath the upper recess 130a.

Referring to FIG. 3, the first mask layer 115 and the pad oxide layer 110 may be partially removed from the semiconductor substrate 100 using the first photoresist pattern 120 as an etching mask to expose a portion of the semiconductor substrate 100 and to form a pad oxide layer pattern 112 and a first mask pattern 118 on the semiconductor substrate 100. The first mask pattern 118 and the pad oxide layer pattern 112 may be used as etching masks for forming an upper portion of the gate recess 130, i.e., an upper recess 130a. The first photoresist pattern 120 may be removed, e.g., by an ashing process and/or a stripping process.

The exposed portion of the semiconductor substrate 100 may be anisotropically etched using the first mask pattern 118 and the pad oxide layer pattern 112 as etching masks to form the upper recess 130a at the upper portion of the semiconductor substrate 100. The upper recess 130a may extend downward from a top surface of the semiconductor substrate 100, and may have a predetermined depth. In embodiments of the invention, e.g., the upper recess 130a may be formed by a reactive ion etching process using an etching gas including chlorine (Cl). A cleaning process for removing reaction by-products, e.g., polymer, which may be formed in the reactive ion etching process, may be further performed.

In embodiments of the invention, the first photoresist pattern 120, the first mask pattern 118, the pad oxide layer pattern 112 and the upper recess 130a may be simultaneously formed through a single etching process.

Referring to FIG. 4, a protective layer may be formed on, e.g., a bottom wall (not shown) and/or sidewalls of the upper recess 130a, sidewall(s) of the pad oxide layer pattern 112, and sidewall(s) of the first mask pattern 118. The protective layer may protect the sidewall(s) of the upper recess 130a, the pad oxide layer pattern 112 and the first mask pattern 118 while a portion of the semiconductor substrate 100 exposed by a bottom surface of the upper recess 130a is etched. Thus, the protective layer may be advantageously formed using a material having an etching selectivity relative to the semiconductor substrate 100. In embodiments of the invention, the protective layer may be formed using an oxide such as silicon oxide and/or a nitride such as silicon nitride. The protective layer may be partially removed by an etch-back process to form a protective layer pattern 125 on the sidewall(s) of the upper recess 130a, the pad oxide layer pattern 112 and the first mask pattern 118, and to expose the bottom surface of the upper recess 130a.

The portion of the semiconductor substrate 100 exposed by the bottom surface of the upper recess 130a may be etched using the protective layer pattern 125 as an etching mask to form a lower recess 130b that may correspond to a lower portion of the gate recess 130. The lower recess 130b may be formed by, e.g., an isotropic etching process, to have a width Wb, along the first direction, e.g., x-direction, which is substantially wider than a width Wa of the upper recess 130a along the first direction, e.g., x-direction. For example, the lower recess 130b may be formed by an isotropic dry etching process using an etching gas including, e.g., sulfur hexafluoride ($SF_6$) gas, chlorine gas ($Cl_2$) and/or oxygen gas ($O_2$). Thus, the gate recess 130 having the upper recess 130a and the lower recess 130b may be formed in the active region 104 of the semiconductor substrate 100. The silicon fence may not be formed between the isolation layer 105 and the gate recess 130 because the lower recess 130b may have the width Wb wider than the width Wa of the upper recess 130a.

Figure 5:
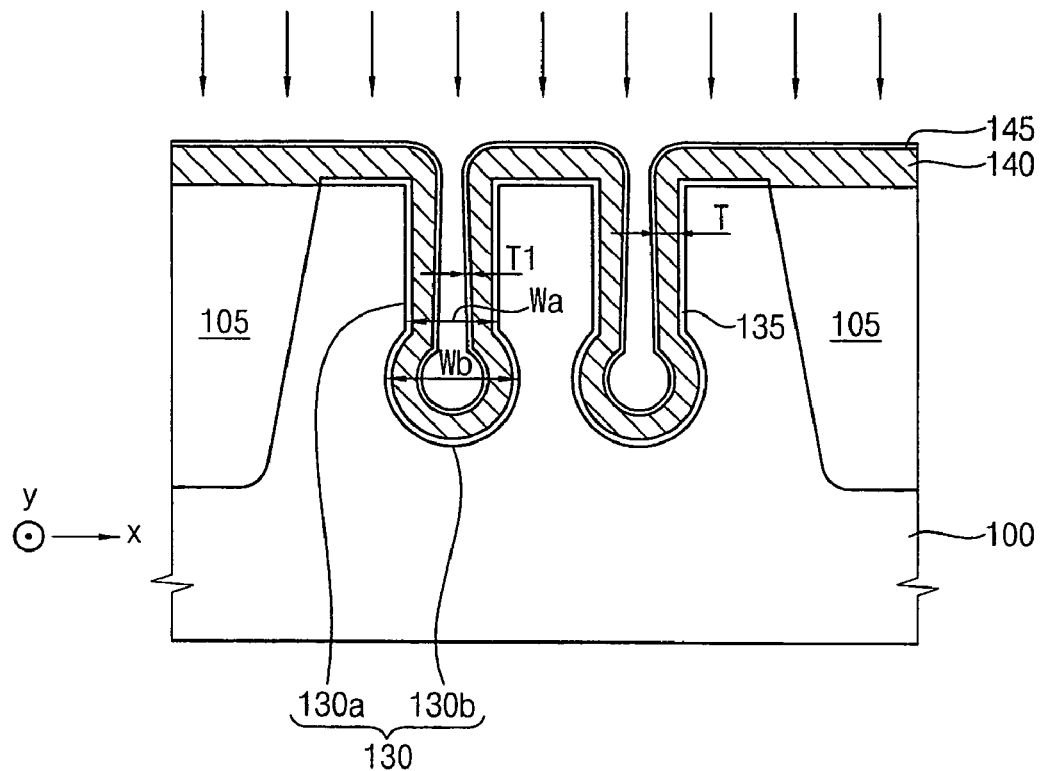
Figure 6:
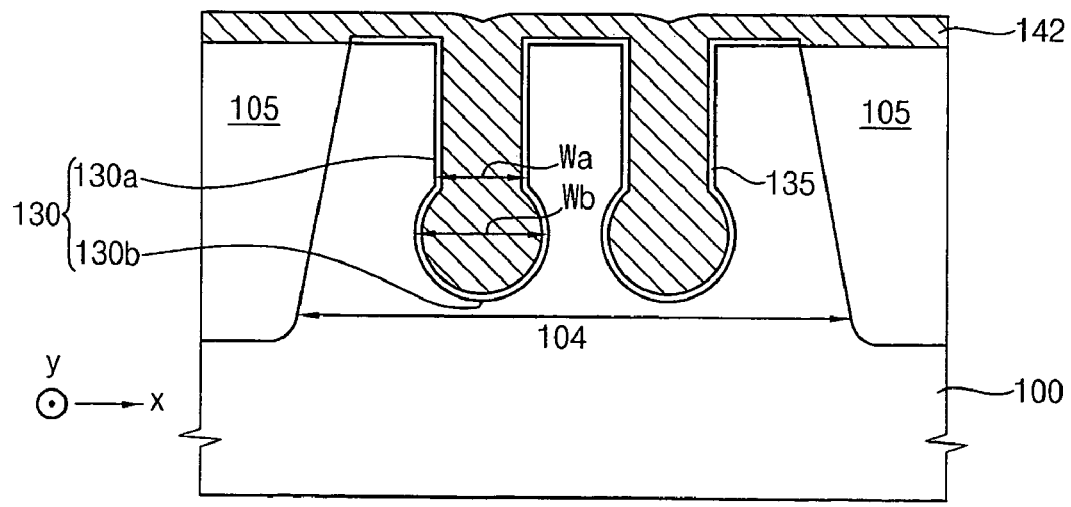

FIG. 5 illustrates a cross-sectional view of a first silicon layer 140 and a silicon oxide layer 145 sequentially formed in the gate recess in FIG. 4; and FIG. 6 illustrates a cross-sectional view of a recess-filling layer 142 of silicon.

Referring to FIGS. 5 and 6, a wet-etching process may be performed to remove the protective layer pattern 125. In embodiments of the invention, the protective layer pattern 125 may be removed by, e.g., a wet-etching process using an etching solution including ammonium hydroxide ($NH_4OH$), hydrogen peroxide ($H_2O_2$), and water ($H_2O$). The first mask pattern 118 and the pad oxide layer 112 may be removed to expose the active region 104 of the semiconductor substrate 100. In embodiments of the invention, the first mask pattern 118 may be removed using an etching solution including, e.g., phosphoric acid, and the pad oxide layer pattern 112 may be removed using, e.g., a diluted hydrofluoric acid solution.

A gate insulation layer 135 may be formed on the exposed active region of the semiconductor substrate 100 and an inner surface of the gate recess 130. The gate insulation layer 135 may be formed using, e.g., silicon oxide by a thermal oxidation process. In embodiments of the invention, the gate insulation layer 135 may be formed using, e.g., a metal oxide having a high dielectric constant.

The first silicon layer 140 may be formed on the semiconductor substrate 100 having the gate insulation layer 135 and the isolation layer 105. As illustrated in FIG. 5, the first silicon layer 140 may be continuously formed on the semiconductor substrate 100 including the upper recess 130a and the lower recess 130b of the gate recess 130. The first silicon layer 140 may be formed to have a relatively small thickness T so that an opening of the gate recess 130 may not be closed. In embodiments of the invention, a ratio between the width Wa of the upper recess 130a and the thickness T of the first silicon layer 140 may be about 1:0.3 to about 1:0.4, so that an opening of the gate recess 130 may be prevented from being closed. The first silicon layer 140 may be formed using, e.g., amorphous silicon doped with impurities. In embodiments of the invention, the first silicon layer may be formed, e.g., using silane ($SiH_4$) gas and phosphine ($PH_3$) gas at a temperature of about 450° C. to about 550° C.

The silicon oxide layer 145 may be formed on the first silicon layer 140. The silicon oxide layer 145 may be formed to have a thickness $T_1$ of about 10 Å to about 50 Å. In embodiments of the invention, the silicon oxide layer 145 may be formed by, e.g., introducing water vapor or oxygen gas into a chamber containing the semiconductor substrate 100.

Heat treatment may be performed on the semiconductor substrate 100 having the silicon oxide layer 145 and the first silicon layer 140 under a reducing atmosphere in which the silicon oxide layer 145 may be reduced. Thus, silicon atoms included in the silicon oxide layer 145 and/or the first silicon layer 140 may move toward the lower recess 130b to sufficiently fill up the lower recess 130b and the upper recess 130a. In embodiments of the invention, the heat treatment may be performed at a temperature of about 850° C. to about 1,000° C. under a reducing atmosphere including hydrogen gas ($H_2$). The oxygen atoms of the silicon oxide layer 145 may be reduced by the hydrogen gas, and may be removed as a type of hydroxyl ion ($OH^-$) or water vapor ($H_2O$). Simultaneously, the silicon atoms may move toward the lower recess 130b to sufficiently fill up the gate recess 130. The silicon oxide layer 145 may function as a kind of barrier that prevents the silicon atoms from closing the entrance of the gate recess 130 at an initial stage of the heat treatment so that the gate recess 130 may be sufficiently filled with the silicon atoms without a generation of a void therein.

In embodiments of the invention, the first silicon layer 140 may be crystallized, and impurities included in the first silicon layer 140 may be electrically activated while the heat treatment is performed. In such embodiments, the recess-filling layer 142 of silicon may sufficiently fill up the gate recess 130, which may be formed on the semiconductor substrate 100 and may include the gate insulation layer 135 and the isolation layer 105. The recess-filling layer 142 may include, e.g., doped polysilicon.

Figure 7:
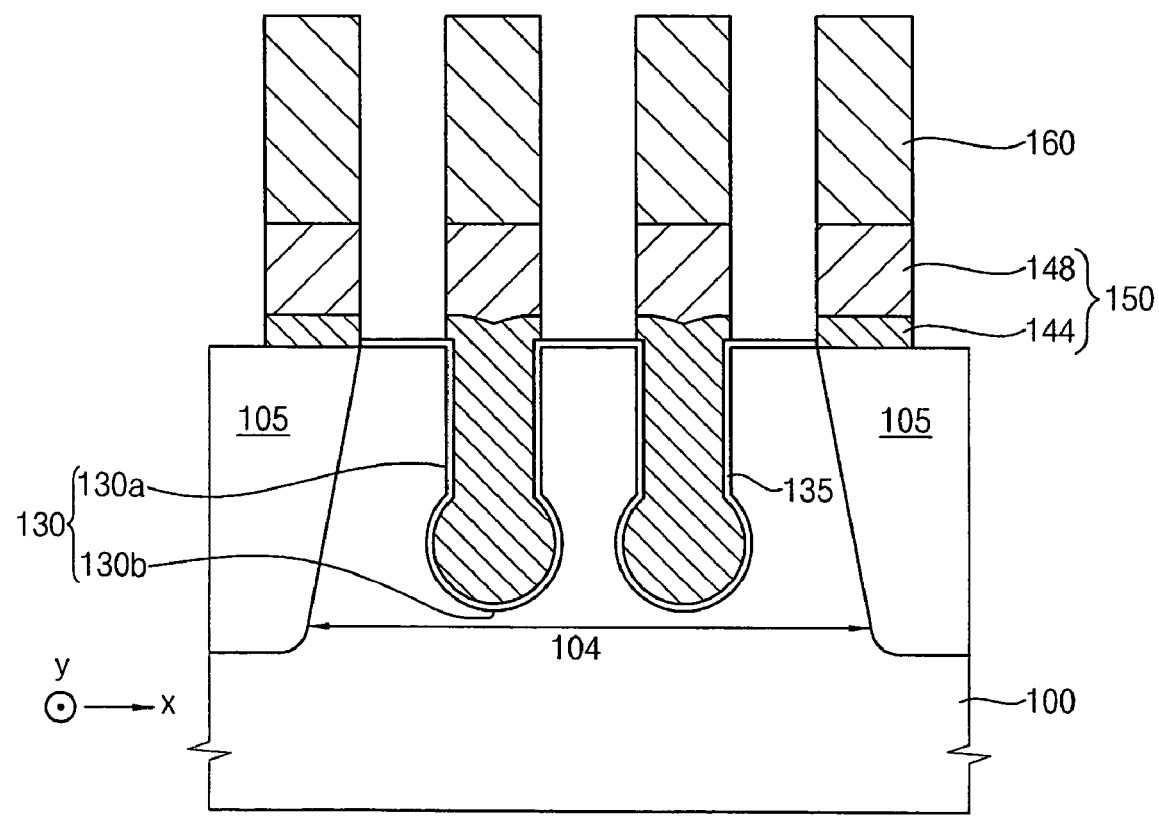

FIG. 7 illustrates a cross-sectional view of a gate electrode including a first silicon layer pattern 144 and a second silicon layer pattern 148.

Referring to FIG. 7, a second silicon layer may be formed on the recess-filling layer 142 of silicon. The second silicon layer may be formed using, e.g., polysilicon doped with impurities. In embodiments of the invention, the second silicon layer may be formed using, e.g., silane gas and phosphine gas at a temperature of about 580° C. to about 620° C.

The second silicon layer and the recess-filling layer 142 may be patterned to form a gate electrode 150 of which a lower portion is formed at an upper portion of the semiconductor substrate 100. For example, a second mask layer and a second photoresist pattern (not shown) may be sequentially formed on the second silicon layer. The second mask layer may be partially removed from the semiconductor substrate 100 using the second photoresist pattern as an etching mask to form a second mask pattern 160. The second silicon layer and the recess-filling layer 142 may be anisotropically etched using the second mask pattern 160 as an etching mask to form the first silicon layer pattern 144 and the second silicon layer pattern 148 sequentially formed on the semiconductor substrate 100.

In embodiments of the invention, an upper portion of the recess-filling layer 142 may be planarized by a chemical mechanical polishing (CMP) process or an etch-back process prior to forming the second silicon layer on the recess-filling layer 142.

Upper portions of the active region of the semiconductor substrate 100 may be doped with impurities to form source/drain regions in the active region 104. The source/drain regions (not shown) may be formed along the first direction, e.g., x-direction, of the semiconductor substrate 100. As a result, a transistor of a semiconductor device such as a dynamic random-access memory (DRAM) device may be completed.

Figure 8:
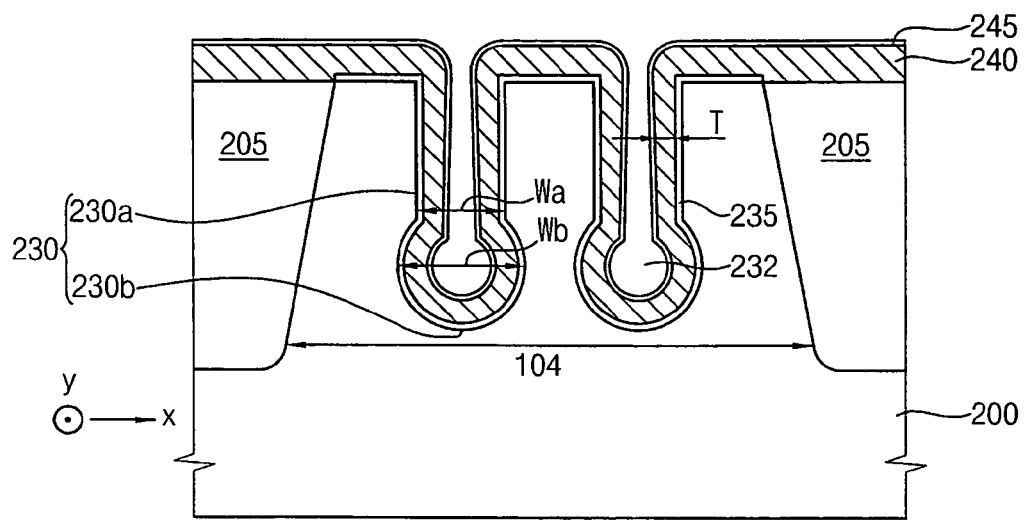
FIGS. 8 to 10 illustrate cross-sectional views of resulting structures of stages of a second example embodiment of a method of forming a recessed gate in accordance with one or more aspects of the invention.
Figure 9:
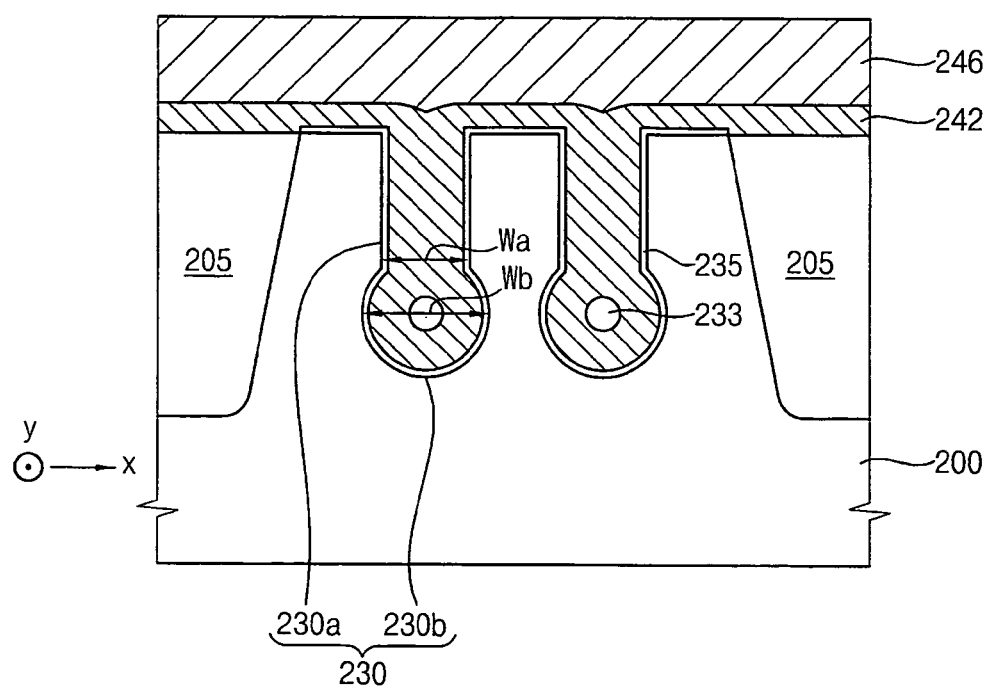
Figure 10:
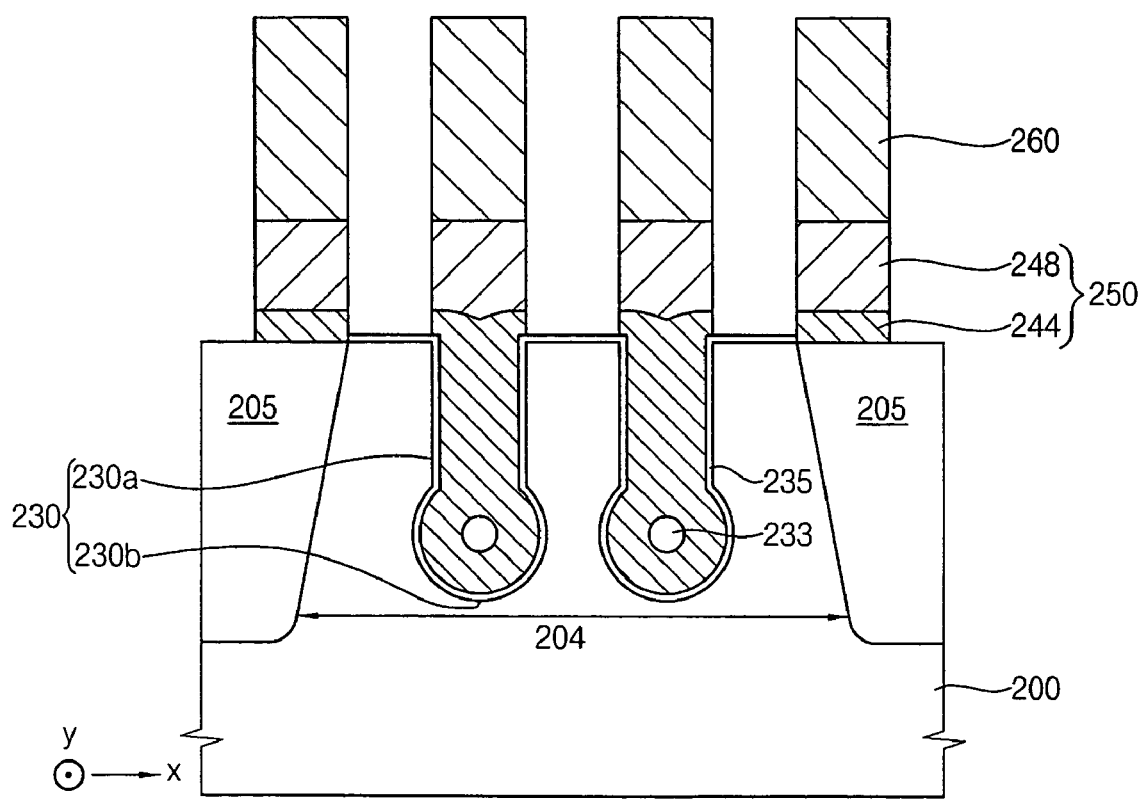

In some cases, the above-mentioned movement of the silicon atoms from the silicon oxide layer 145 and/or the first silicon layer 140 to the gate recess 130, as a result of the heat treatment, may not be sufficient to fill up the gate recess 130. Thus, a void (not shown) may be formed within the lower recess 130b. Such a void may have a significantly reduced size due to the movement of the silicon atoms generated by the heat treatment, but even a void having a reduced size may deteriorate characteristics of a semiconductor device including the gate recess 130 if the void makes contact with the gate insulation layer 135. FIGS. 8-10, described below, illustrate resulting structures corresponding to stages of a second example embodiment of the invention, by which the deterioration of the semiconductor device resulting from such a void may be avoided.

FIGS. 8 to 10 illustrate cross-sectional views of resulting structures of stages of a second example embodiment of a method of forming a recessed gate in accordance with one or more aspects of the invention.

More particularly, FIG. 8 illustrates a cross-sectional view of a first silicon layer 240 and a silicon oxide layer 245, which may be formed on a semiconductor substrate 200 including a gate insulation layer 235 and an isolation layer 205, and FIG. 9 illustrates a cross-sectional view of a recess-filling layer 242 and a second silicon layer formed on the recess-filling layer.

Referring to FIGS. 8 and 9, an isolation layer 205 may be formed at an upper portion of a semiconductor substrate 200 to define an active region 204 of the semiconductor substrate 200. The semiconductor substrate 200 may include a silicon wafer. In embodiments of the invention, the isolation layer 205 may be formed by an STI process. The active region 204 may be partially etched to form a gate recess 230 including an upper recess 230a and a lower recess 230b formed beneath the upper recess 230a. The upper recess 230a, which may correspond to an upper portion of the gate recess 230, may extend downward from a top surface of the semiconductor substrate 200, and the lower recess 230b, which may correspond to a lower portion of the gate recess 230, may extend beneath the upper recess 230a. The lower recess 230b may have a width Wb that is substantially wider than a width Wa of the upper recess 130a. A gate insulation layer 235 may be formed on the active region 204, a bottom surface of the gate recess 230 and/or sidewall(s) of the gate recess 230.

Methods of forming the above-mentioned components may be substantially the same as the methods of forming the recessed gate in accordance with the first example embodiment described with reference to FIGS. 2 through 5. Thus, repetitive detailed explanations will be omitted below.

The first silicon layer 240 may be continuously formed on the semiconductor substrate 200 having the gate insulation layer 235 and the isolation layer 205. The first silicon layer 240 may be formed to have a relatively small thickness T so that an opening of the gate recess 230 may not be closed. As a result, an open void or a seam 232 may be formed within the gate recess 230. The first silicon layer 240 may be formed using, e.g., amorphous silicon heavily doped with impurities having a first concentration. The first silicon layer 240 may have a relatively high impurity concentration such that the open void 232 may be prevented from moving in the gate recess 230 during a subsequent high temperature processing. In embodiments of the invention, the first silicon layer 240 may be formed using, e.g., amorphous silicon doped with phosphorus at a concentration of about $2.0 \times 10^{20}$ atoms/cm$^3$ to about $5.0 \times 10^{20}$ atoms/cm$^3$. The first silicon layer 240 may be doped with phosphorus using phosphine (PH$_3$) gas.

The silicon oxide layer 245 may be formed on the first silicon layer 240, and heat treatment may be performed on the semiconductor substrate 200 having the silicon oxide layer 245 and the first silicon layer 240 under a reducing atmosphere in which the silicon oxide layer 245 may be reduced. Thus, silicon atoms included in the silicon oxide layer 245 and/or the first silicon layer 240 may move toward the lower recess 230b to sufficiently fill up the gate recess 230. In addition, the first silicon layer 240 may be crystallized and impurities included in the first silicon layer 240 may be electrically activated while the heat treatment is performed. Accordingly, a recess-filling layer 242 of silicon that sufficiently fills up the gate recess 230 may be formed on the semiconductor substrate 200 having the gate insulation layer 235 and the isolation layer 205. A method of forming the recess-filling layer of silicon 242 is substantially the same as that used in forming the recessed gate in accordance with the first example embodiment described with reference to FIGS. 5 and 6. Thus, repetitive detailed explanations will be omitted below.

The open void or the seam 232 may not be completely removed from the gate recess 230, thereby remaining as a void 233, as illustrated in FIG. 9. The upper recess 230a may have the width Wa that is substantially narrower than the width Wb of the lower recess 230b. Thus, even though the recess-filling layer 242 may sufficiently fill up the upper recess 230a, the lower recess 230b may not be sufficiently filled with silicon atoms of the recess-filling layer 242, and the void 233 may remain in the lower recess 230b.

A second silicon layer 246 may be formed on the recess-filling layer 242 of silicon. In embodiments of the invention, the second silicon layer 246 may be formed using, e.g., polysilicon doped with impurities having a second concentration that is substantially lower than the first concentration of the first silicon layer 240. Thus, a doping concentration of a gate electrode 250 (see FIG. 10), which may be subsequently formed by patterning the second silicon layer 246 and the recess-filling layer 242, may be controlled.

In embodiments of the invention, impurities doped into the second silicon layer 246 may be substantially the same as those doped into the first silicon layer 240. The second silicon layer 246 may be formed using, e.g., polysilicon doped with phosphorus at a concentration of about $1.0 \times 10^{20}$ atoms/cm$^3$ to about $2.0 \times 10^{20}$ atoms/cm$^3$. In embodiments of the invention, the second silicon layer 246 may be formed in situ in a chamber in which the first silicon layer 240 is formed.

FIG. 10 illustrates a cross-sectional view of a gate electrode including a first silicon layer pattern and a second silicon layer pattern.

Referring to FIG. 10, a mask pattern 260 may be formed on the second silicon layer 246. The second silicon layer 246 and the recess-filling layer 242 of silicon may be anisotropically etched using the mask pattern 260 as an etching mask to form a first silicon layer pattern 244 and a second silicon layer pattern 248 sequentially on the semiconductor substrate 200. Thus, the gate electrode 250, including the first and the second silicon layer patterns 244 and 248, may be formed on the semiconductor substrate 200. Methods of forming the above-mentioned components may be substantially the same as the methods of forming the recessed gate in accordance with the first example embodiment described with reference to FIG. 7. Thus, repetitive detailed explanations will be omitted below.

As mentioned above, the recess-filling layer 242 having the void 233 may be heavily doped with impurities so that the void 233 may be prevented from moving around within the gate recess 230 during subsequent high-temperature processing. Thus, the void 233 within the recess-filling layer 242 may be prevented from directly making contact with the gate insulation layer 235. Thus, embodiments of the invention enable an operational defect, which may result from a leakage current or a threshold voltage distribution defect, to be easily reduced and/or prevented in spite of the existence of one or more void(s) 233 within the recess-filling layer 242.

Figure 11:
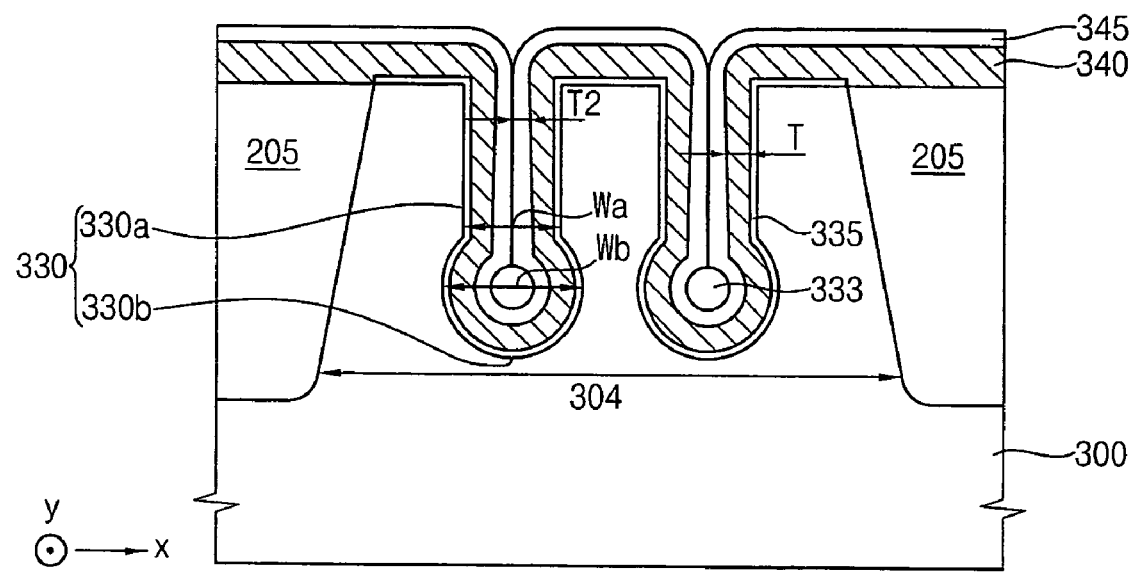
FIGS. 11 and 12 illustrate cross-sectional views of resulting structures of stages of a third example embodiment of a method of forming a recessed gate in accordance with one or more aspects of the invention.
Figure 12:
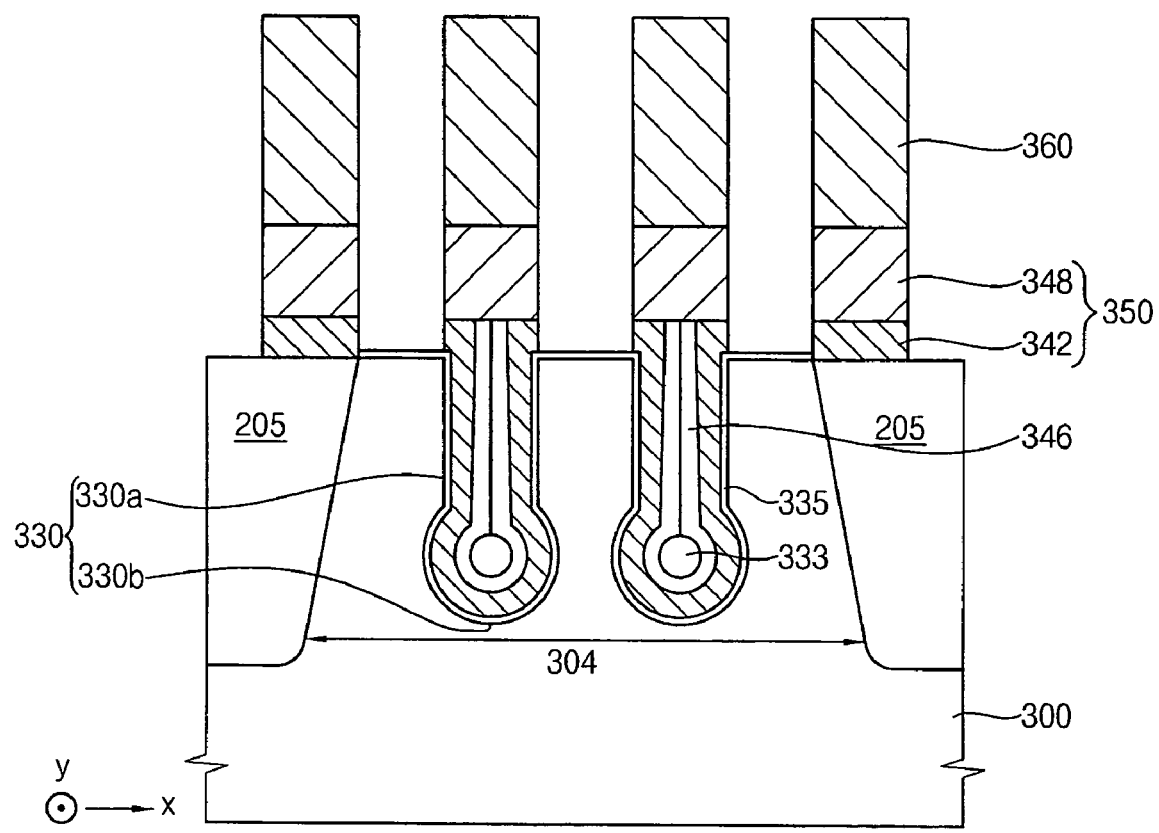

FIGS. 11 and 12 illustrate cross-sectional views of resulting structures of stages of a third example embodiment of a method of forming a recessed gate in accordance with one or more aspects of the invention. More particularly, FIG. 11 illustrates a cross-sectional view of a first silicon layer 340 and a stop layer 345 sequentially formed on a gate insulation layer 335.

Referring to FIG. 11, an isolation layer 305 may be formed at an upper portion of a semiconductor substrate 300 to define an active region 304 of the semiconductor substrate 300. The semiconductor substrate 300 may include a silicon wafer. In embodiments of the invention, the isolation layer 305 may be formed by an STI process. An upper recess 330a, which may extend downward from a top surface of the semiconductor substrate 300, may be formed in the active region 304 of the semiconductor substrate 300. A lower recess 330b may have a width Wb that is substantially wider than a width Wa of the upper recess 330a. The lower recess 330b may be continuously formed beneath the upper recess 330a. Thus, a gate recess 330 including the upper recess 330a and the lower recess 330b may be formed in the active region 304 of the semiconductor substrate 300. The gate insulation layer 335 may be formed on the active region, and a bottom surface and a sidewall(s) of the gate recess 330.

The first silicon layer 340 may be continuously formed on the semiconductor substrate 300 including the gate insulation layer 335 and the isolation layer 305. In embodiments of the invention, the first silicon layer 340 may be formed to have a relatively small thickness T so that an opening of the gate recess 330 may not be closed. Accordingly, an open void or a seam may be formed within the gate recess 330.

Methods of forming the above-mentioned components may be substantially the same as the methods used in forming the recessed gate in accordance with the first example embodiment described with reference to FIGS. 2 to 5. Thus, repetitive detailed explanations will be omitted below.

The stop layer 345 may have a high thermal resistance, and may be formed, e.g., on the first silicon layer 340, which may prevent a void 333 from moving around within the gate recess 330 due to movements of silicon atoms included in the first silicon layer 340. In embodiments of the invention, the stop layer 345 may be formed using silicon oxide. The stop layer 345, including, e.g., silicon oxide, may be formed to have a thickness $T_1$ of about 100 Å to about 400 Å by a thermal oxidation process. In embodiments of the invention, the stop layer 345 may be formed to have a sufficiently large thickness $T_2$ so that the opening of the gate recess 330 may be closed and simultaneously the void 333 may remain within the lower recess 330b. Thus, the void 333 is restricted within the stop layer 345, and movement of the void 333 may be prevented during subsequent high-temperature processing.

FIG. 12 illustrates a cross-sectional view illustrating a gate electrode 350 formed from the first silicon layer 340 and a second silicon layer (not shown).

Referring to FIG. 12, a portion of the stop layer 345 disposed outside of the gate recess 330 may be removed from the semiconductor substrate 300 to expose the first silicon layer 340 that is disposed outside of the gate recess 330, thereby forming a stop layer pattern 346 on the first silicon layer 340. In embodiments of the invention, the portion of the stop layer 345 disposed outside of the gate recess 330 may be removed, e.g., by a CMP process or an etch-back process.

The second silicon layer (not shown) and a third mask pattern 360 may be sequentially formed on the first silicon layer 340. The second silicon layer and the first silicon layer 340 may be partially removed using the third mask pattern 360 as an etching mask by an etching process, thereby sequentially forming a first silicon layer pattern 342 and a second silicon layer pattern 348 on the semiconductor substrate 300. Thus, the gate electrode 350 may be formed on the semiconductor substrate 300, and may include the first and the second silicon layer patterns 342 and 348 and the stop layer pattern 346 sequentially formed on the semiconductor substrate 300.

As described above, the stop layer pattern 346 may prevent the movement of the void 333 even though the void 333 may remain within the gate electrode 350. Accordingly, the gate insulation layer 335 may be prevented from making contact with the void 333. Thus, deterioration of a threshold voltage distribution due to a leakage current generated from the gate insulation layer 335 may be prevented.

According to example embodiments of the invention, a void may be prevented from being formed within a recessed gate electrode, which includes a lower portion having a width substantially wider than that of an upper portion thereof. Embodiments of the invention separately enable movement of the void may be effectively reduced and/or prevented even though a void may be formed in the recessed gate electrode. Thus, reliability and a production yield of a semiconductor device including the above-mentioned recessed gate may be improved.

The foregoing is illustrative of the invention and is not to be construed as limiting thereof. Although a few example embodiments of the present invention have been described, those skilled in the art will readily appreciate that many modifications are possible in the example embodiments without materially departing from the novel teachings and advantages of the invention. Accordingly, all such modifications are intended to be included within the scope of the invention as defined in the claims. Therefore, it is to be understood that the foregoing is illustrative of the invention and is not to be construed as limited to the specific example embodiments disclosed, and that modifications to the disclosed example embodiments, as well as other example embodiments, are intended to be included within the scope of the appended claims. The invention is defined by the following claims, with equivalents of the claims to be included therein.

Example embodiments of the invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the invention as set forth in the following claims.

What is claimed is:

1. A method of forming a recessed gate, comprising:
  forming a gate recess including an upper recess and a lower recess at an upper portion of a semiconductor substrate, the lower recess having a width substantially wider than that of the upper recess;
  forming a gate insulation layer on an inner surface of the gate recess;
  forming a first silicon layer on the semiconductor substrate including the gate insulation layer;
  forming a silicon oxide layer on the first silicon layer;
  performing heat treatment on the semiconductor substrate under a reducing atmosphere to selectively remove an oxygen component from the silicon oxide layer and to form a recess-filling layer of silicon on the semiconductor substrate;
  forming a second silicon layer on the recess-filling layer; and
  forming a gate electrode by patterning the second silicon layer and the recess-filling layer.

2. The method as claimed in claim 1, wherein an upper portion of the semiconductor substrate is anisotropically etched to form the upper recess, and wherein a portion of the semiconductor substrate exposed by a bottom surface of the upper recess is isotropically etched to form the lower recess.

3. The method as claimed in claim 1, wherein forming the silicon oxide layer is performed by supplying oxygen gas or water vapor onto the first silicon layer.

4. The method as claimed in claim 1, wherein the reducing atmosphere includes hydrogen gas.

5. The method as claimed in claim 4, wherein the heat treatment is performed to remove substantially all the oxygen components from the silicon oxide layer.

6. The method as claimed in claim 1, wherein the first silicon layer is formed using amorphous silicon doped with impurities having a first concentration, and the second silicon layer is formed using polysilicon doped with impurities having a second concentration substantially lower than the first concentration.

7. The method as claimed in claim 6, wherein the first concentration is about $2.0 \times 10^{20}$ atoms/cm$^3$ to about $5.0 \times 10^{20}$ atoms/cm$^3$, and the second concentration is about $1.0 \times 10^{20}$ atoms/cm$^3$ to about $2.0 \times 10^{20}$ atoms/cm$^3$.

8. The method as claimed in claim 1, wherein silicon atoms included in at least one of the first silicon layer and the silicon oxide layer move toward the gate recess to form the recess-filling layer that fills up the gate recess.

9. The method as claimed in claim 1, wherein forming the first silicon layer comprises continuously forming the first silicon layer on the semiconductor substrate including the gate insulation layer.

10. The method as claimed in claim 1, wherein a ratio between the width of the upper recess and a thickness of the first silicon layer is about 1:0.3 to about 1:0.4.

11. The method as claimed in claim 1, wherein the heat treatment is performed at a temperature of about 850° C. to about 1,000° C.

12. A method of forming a recessed gate, comprising:
  forming a gate recess including an upper recess and a lower recess at an upper portion of a semiconductor substrate, the lower recess having a width substantially wider than that of the upper recess;
  forming a gate insulation layer on an inner surface of the gate recess;
  forming a first silicon layer on the semiconductor substrate including the gate insulation layer to form an open void within the gate recess;
  forming a stop layer having a high thermal resistance on the first silicon layer to prevent a void from moving around within the gate recess;
  forming a second silicon layer on the first silicon layer; and
  patterning the second and the first silicon layers to form a gate electrode.

13. The method as claimed in claim 12, wherein the stop layer is formed using silicon oxide.

14. The method as claimed in claim 13, wherein the stop layer is formed by a thermal oxidation process.

15. The method as claimed in claim 12, prior to forming the second silicon layer, further comprising removing a portion of the stop layer that remains outside of the gate recess.

16. The method as claimed in claim 15, wherein removing the portion of the stop layer comprises removing the portion of the stop layer by at least one of a chemical mechanical polishing process and an etch-back process.

17. The method as claimed in claim 12, wherein forming the stop layer comprises forming the stop layer to have a thickness larger than a thickness of the first silicon layer.

18. The method as claimed in claim 12, wherein forming the first silicon layer comprises continuously forming the first silicon layer on the semiconductor substrate including the gate insulation layer.

19. The method as claimed in claim 12, wherein a ratio between the width of the upper recess and a thickness of the first silicon layer is about 1:0.3 to about 1:0.4.

20. The method as claimed in claim 12, wherein forming the stop layer comprises filling the open void within the gate recess with the stop layer.

\* \* \* \* \*